United States Patent
Klein

(10) Patent No.: US 9,842,977 B2
(45) Date of Patent: Dec. 12, 2017

(54) CIRCUIT BOARD AND METHOD OF MANUFACTURE

(71) Applicant: Raul A. Klein, Las Vegas, NV (US)

(72) Inventor: Raul A. Klein, Las Vegas, NV (US)

( * ) Notice: Subject to any disclaimer, the term of this patent is extended or adjusted under 35 U.S.C. 154(b) by 8 days.

(21) Appl. No.: 15/177,322

(22) Filed: Jun. 8, 2016

(65) Prior Publication Data
US 2016/0343916 A1    Nov. 24, 2016

(51) Int. Cl.
| | |
|---|---|
| *H01J 1/62* | (2006.01) |
| *H01L 33/64* | (2010.01) |
| *H01L 33/62* | (2010.01) |
| *H01L 25/075* | (2006.01) |
| *H05K 1/02* | (2006.01) |

(52) U.S. Cl.
CPC ........ *H01L 33/642* (2013.01); *H01L 25/0753* (2013.01); *H01L 33/62* (2013.01); *H05K 1/0209* (2013.01); *H05K 2201/10106* (2013.01)

(58) Field of Classification Search
CPC ........ H01K 2201/10106; H01K 1/0209; H01L 25/0753; H01L 33/62
USPC ......................................... 313/498, 506, 512
See application file for complete search history.

(56) References Cited

U.S. PATENT DOCUMENTS

| | | | |
|---|---|---|---|
| 8,309,855 B2 | 11/2012 | Chung | 174/256 |
| 9,204,547 B2 | 12/2015 | Hughes | H05K 1/119 |
| 2009/0308639 A1 | 12/2009 | Chung | 174/254 |
| 2011/0175122 A1* | 7/2011 | Kim | H01L 33/60 |
| | | | 257/98 |
| 2014/0313684 A1 | 10/2014 | Hughes | H05K 1/119 |
| 2015/0351229 A1 | 12/2015 | Lee et al. | H05K 1/0268 |
| 2016/0020500 A1 | 1/2016 | Matsuda | H01P 3/003 |
| 2016/0057853 A1 | 2/2016 | Zacharko et al. | H05K 1/0265 |

\* cited by examiner

*Primary Examiner* — Vip Patel
(74) *Attorney, Agent, or Firm* — Michael R. Schramm

(57) ABSTRACT

An electrical circuit board assembly (ECBA) preferably having at least one LED component and having a substrate that includes a plurality of raised pads formed such that open channels are formed therebetween, and such that the upper surfaces of the pads are preferably substantially coplanar. Such intra-pad channels facilitate heat transfer and cooling of the substrate and the ECBA. Further, such raised pads provide for alternate methods of electrically conductive track manufacturing so as to avoid the necessity of chemical etching which requires the use of hazardous toxic chemicals. Such alternate methods of electrically conductive track construction include adhesive conductive sheet application, conductive ink screen printing, and conductive ink painting.

21 Claims, 5 Drawing Sheets

CIRCUIT BOARD AND METHOD OF MANUFACTURE

FIELD OF THE INVENTION

The present invention relates to electrical circuit boards such as those circuit boards used to perform an electrical function such as lighting a light emitting diode (LED).

BACKGROUND OF THE INVENTION

An electrical circuit board is a board that mechanically supports and electrically connects electrical components using electrically conductive tracks, pads, and other features on a non-conductive substrate. Such circuit boards are often referred to as printed circuit boards or PCBs and typically include electrically conductive tracks that have been etched from copper sheets that have been laminated onto a non-conductive substrate (see Appx A). Such etching process requires masking preparation (adding to the cost of the PCB) and typically requires the use of toxic chemicals during the etching process. Such electrical circuit boards and more especially PCBs are known in the art and have broad application in a variety of electrical appliances. Examples of such circuit boards are disclosed in the following list of US patents and applications, all of which are expressly incorporated herein by reference: U.S. Pat. No. 8,309,855 to Chung, U.S. Pat. No. 9,204,547 to Hughes, US 2009/0308639 to Chung, US 2014/0313684 to Hughes, US 2015/0351229 to Lee et al, US 2016/0020500 to Matsuda, and US 2016/0057853 to Zacharko et al. Further, it is known to provide light emitting diodes or LEDs as an integrated component of such PCBs (see Appx B). It is also known that such LEDs generate significant heat and that such heat can be detrimental to the function and life of such LED PCBs. Accordingly, the management and dissipation of such heat is an important factor in the design of an LED PCB (see Appx C).

SUMMARY OF THE INVENTION

The present invention is an electrical circuit board assembly (ECBA) preferably having at least one LED component and having a substrate that includes a plurality of raised pads formed such that open channels are formed therebetween, and such that the upper surfaces of the pads are preferably substantially coplanar. Such intra-pad channels facilitate heat transfer and cooling of the substrate and the ECBA. Further, such raised pads provide for alternate methods of electrically conductive track manufacturing so as to avoid the necessity of chemical etching which requires the use of hazardous toxic chemicals. Such alternate methods of electrically conductive track construction include adhesive conductive sheet application, conductive ink screen printing, and conductive ink painting (via rolling or dipping/stamping).

DESCRIPTION OF DRAWINGS

In order that the advantages of the invention will be readily understood, a more particular description of the invention briefly described above will be rendered by reference to specific embodiments that are illustrated in the appended drawings.

Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
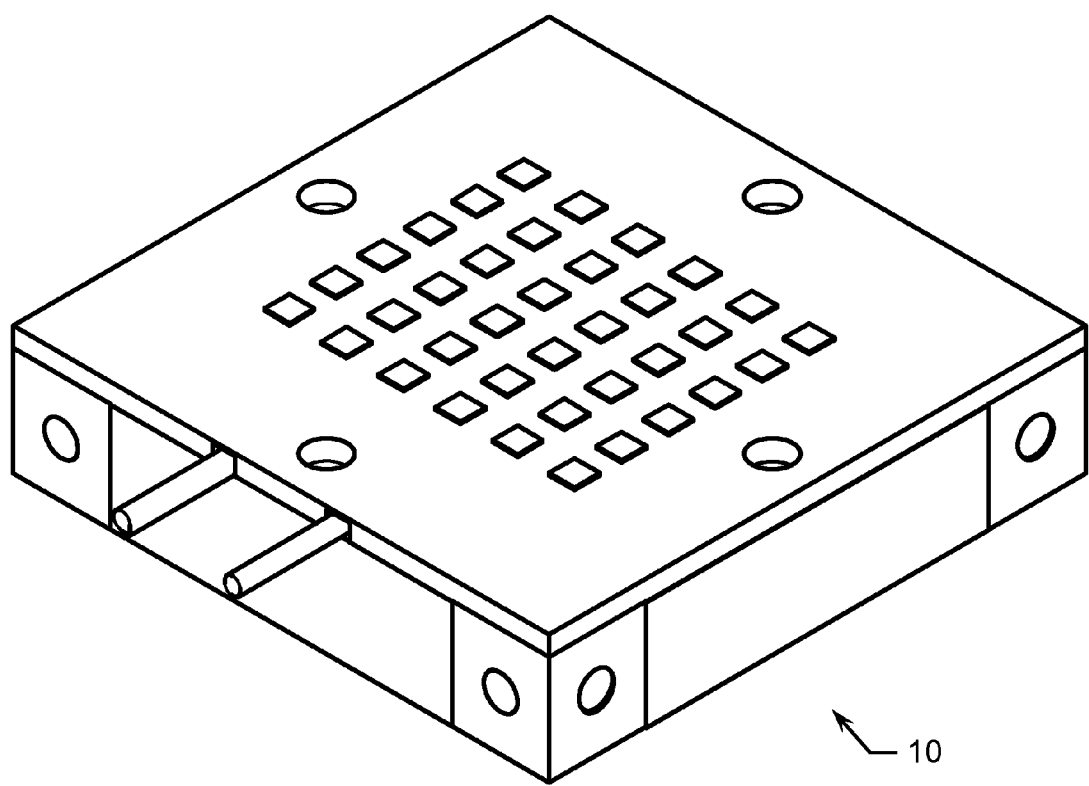
FIG. 1 is a trimetric view of the ECBA in an assembled configuration (looking down on the top of the ECBA)
Figure 2:
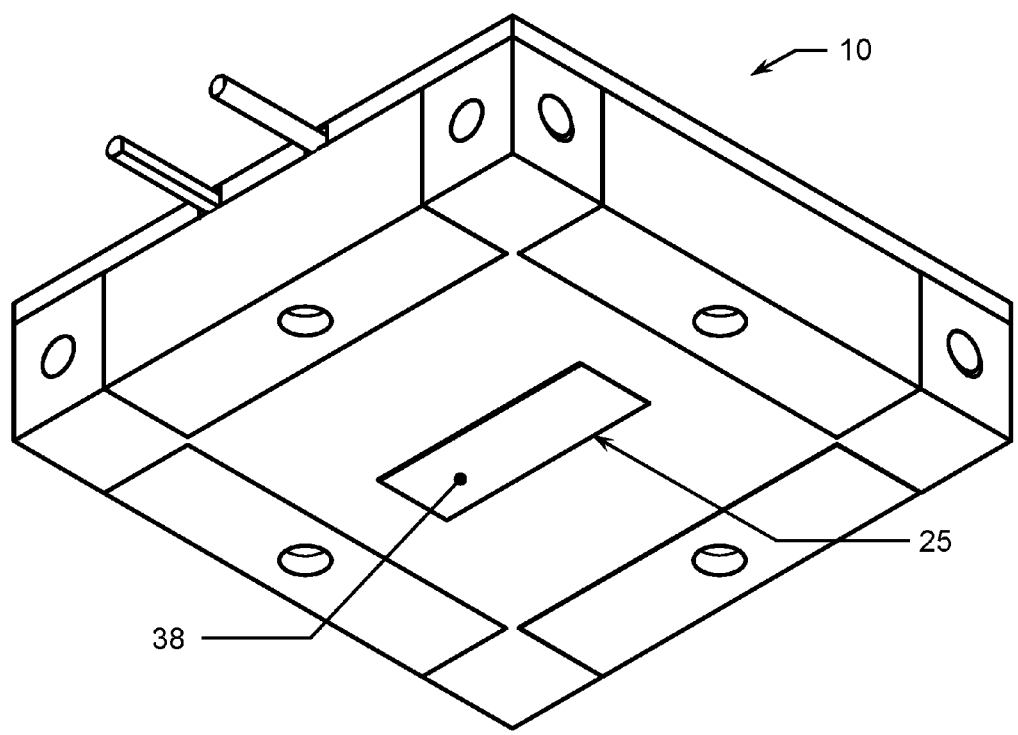
FIG. 2 is a trimetric view of the ECBA in an assembled configuration (looking up at the bottom of the ECBA)
Figure 3:
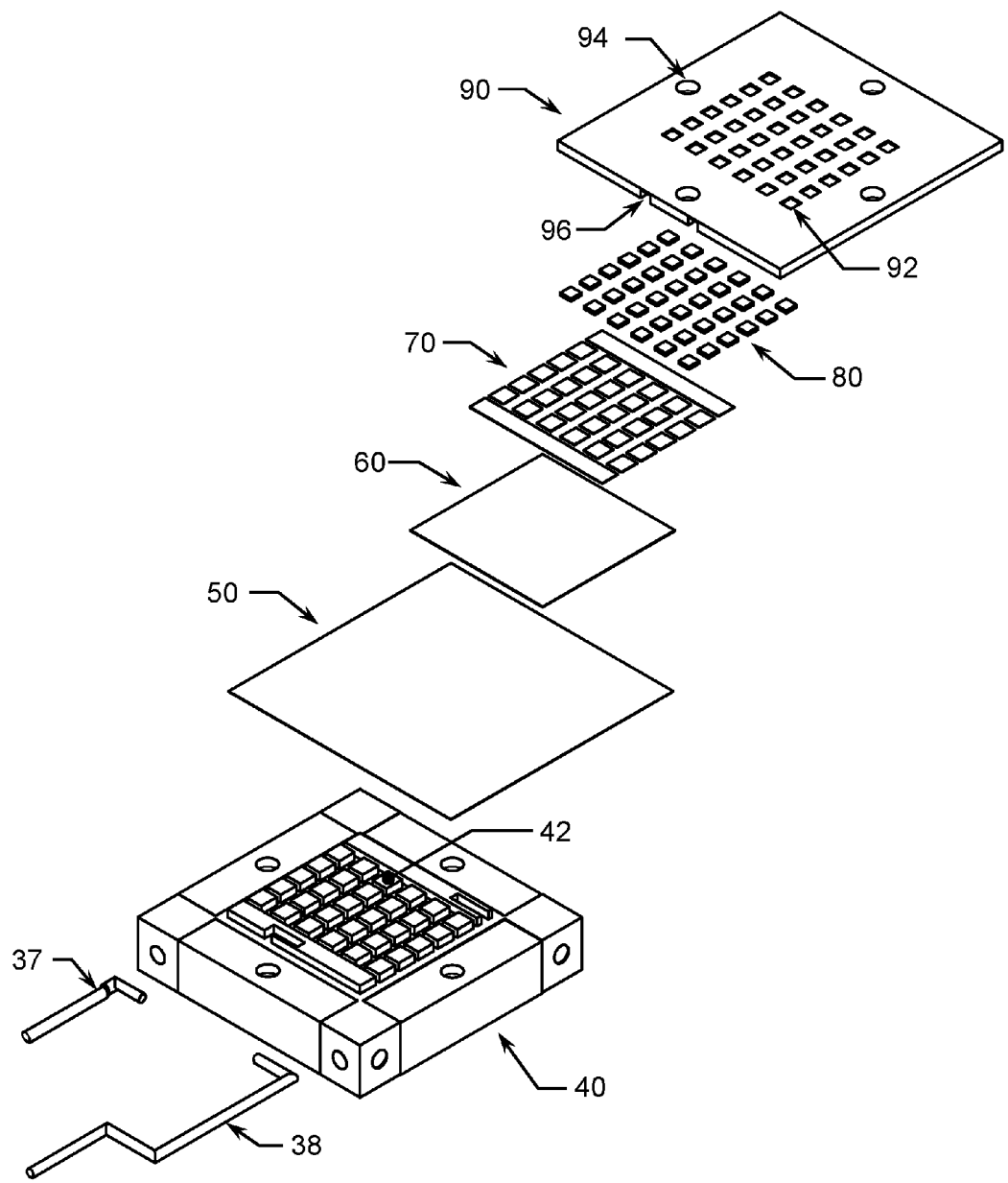
FIG. 3 is an exploded trimetric view of the ECBA in a disassembled configuration but with the substrate subassembly shown assembled.
Figure 4:
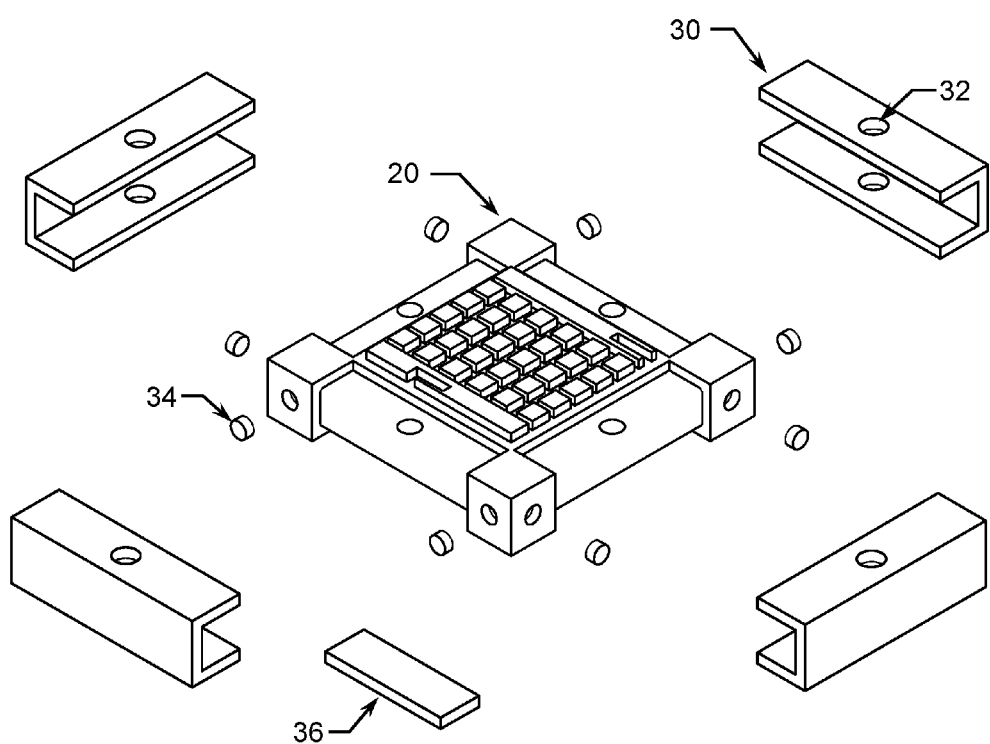
FIG. 4 is an exploded trimetric view of the substrate subassembly.
Figure 5:
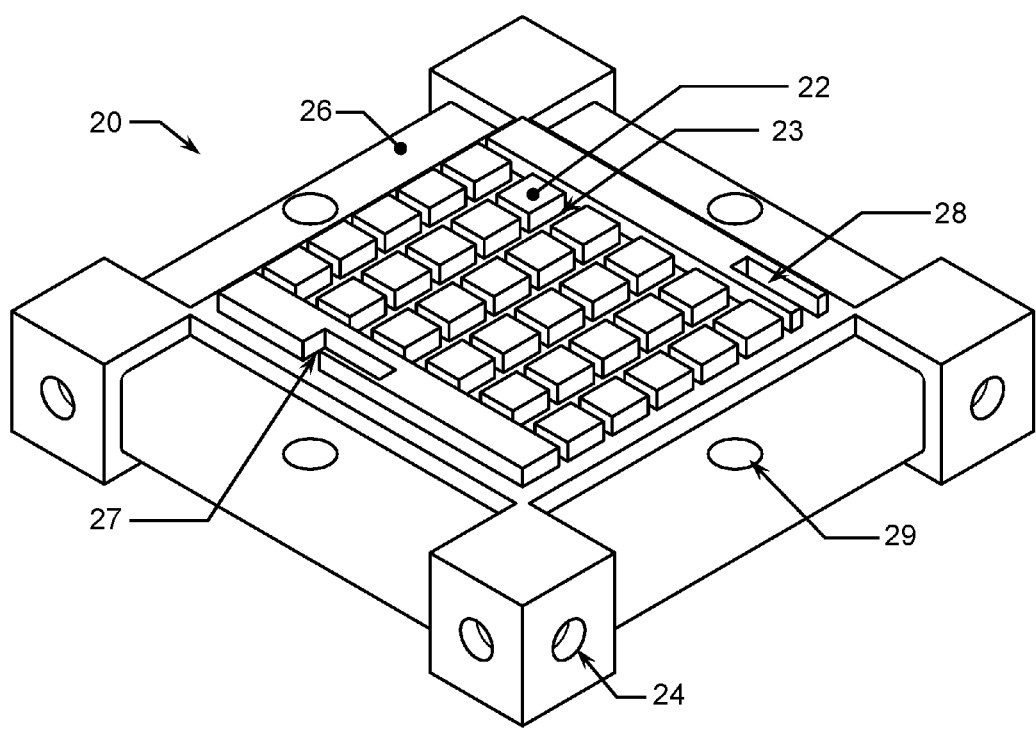
FIG. 5 is a trimetric view of the substrate.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are included to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the invention.

In order to facilitate the understanding of the present invention in reviewing the drawings accompanying the specification, a feature table is provided below. It is noted that like features are like numbered throughout all of the figures.

FEATURE TABLE

| # | Feature | # | Feature |
|---|---|---|---|
| 10 | Electrical Circuit Board Assembly (ECBA) | 20 | Substrate |
| 22 | Raised pad | 23 | Channel |
| 24 | Quick connect magnet reception hole | 25 | Mounting magnet reception pocket |
| 26 | Heat sink reception recess | 27 | Positive lead wire reception slot |
| 28 | Negative lead wire reception slot | 29 | Mounting hole |
| 30 | Heat sink | 32 | Mounting hole |
| 34 | Quick connect magnet | 36 | Mounting magnet |
| 37 | Positive lead wire | 38 | Negative lead wire |
| 40 | Substrate subassembly | 42 | Electrically conductive track |
| 50 | Thermally conductive material | 60 | Dielectric material |
| 70 | Electrically conductive material | 80 | LED chips |
| 90 | Cover | 92 | LED chip opening |
| 94 | Mounting hole | | |

Referring now to the drawings, in a preferred embodiment the invention is an electrical circuit board assembly 10 (ECBA 10) adapted to be constructed without etching and for use in providing light from an LED while efficiently dissipating heat from the LED comprising a substrate subassembly 40, a plurality of LED chips 80, and a cover 90. LED chips 80 define substantially standard LED chips that are adapted to be electrically connected to electrically conductive tracks and are adapted to emit light when electrically energized. Cover 90 comprises a generally flat rectangular nonconductive cover having a plurality of LED chip openings 92, and a plurality of mounting holes 94.

Substrate subassembly 40 comprises substrate 20, a plurality of heat sinks 30, a plurality of quick connect magnets 34, mounting magnet 36, positive lead wire 37, negative lead wire 38, thermally conductive material 50, dielectric material 60, and electrically conductive material 70.

Substrate 20 defines a substantially irregular but generally cubic shaped substrate comprised of a non-electrically conductive material such as plastic, fiberglass, etc. Substrate 20 includes a plurality of preferably substantially coplanar raised pads 22, a plurality of open channels 23 formed therebetween, a plurality of quick connect magnet reception holes 24, a mounting magnet reception pocket 25, a plurality of heat sink reception recesses 26, a positive lead wire reception slot 27, a negative lead wire reception slot 28, and a plurality of mounting holes 29. Substrate 20 may be manufactured by a variety of methods including subtractive processes such as machining substrate 20 from a block of material such as plastic, forming processes such as injection molding substrate 20, and especially in the case of short run manufacturing, additive processes such as creating substrate 20 by stereolithography, 3D printing, selective laser sintering or fused deposition modeling. It is noted that rather than mere rudimentary shapes such as a generally cubic shape, substrate 20 may be generally formed in virtually limitless shapes including spheres, animals, cars, building, people, and abstract shapes (i.e. waves, twisting objects, and asymmetrical objects). Regardless of the overall shape in which substrate 20 is formed, substrate 20 retains the aforementioned features and functions of substrate 20. Further, regardless of the overall shape in which substrate 20 is formed, other members of ECBA 10 are like geometrically adapted so as to fit to and function with substrate 20.

Heat sink 30 defines a substantially elongated channel shaped member preferably constructed of metal or like heat conductive material having a plurality of mounting holes 32 formed substantially in a central location thereof. Quick connect magnet 34 defines a substantially solid cylindrical shaped member constructed preferably of a ferromagnetic material. Mounting magnet 36 defines a substantially solid cubic shaped member constructed preferably of a ferromagnetic material. Positive lead wire 37 and negative lead wire 38 define electrically conducting lead wires that include an insulting outer coating. Thermally conductive material 50 defines an adhesive laminate sheet of thermally conductive material but may alternately take the form of a thermally conductive tape, a thermally conductive spray, or a thermally conductive paint. Dielectric material 60 defines an adhesive laminate sheet of dielectric material but may alternately take the form of a dielectric tape, a dielectric spray, or a dielectric paint. Electrically conductive material 70 defines a preferably frangible adhesive laminate sheet of electrically conductive material but may alternately take the form of electrically conductive ink or paint.

Substrate subassembly 40 is assembled such that thermally conductive material 50 is adhered to or applied to substantially all of the outer surfaces of substrate 20, and especially to the surfaces of raised pads 22, open channels 23, and heat sink reception recesses 26. Dielectric material 60 is then adhered to or applied to substantially all of the outer surfaces of substrate 20. Without masking or etching, electrically conductive material 70 is adhered to or applied to the upper surfaces of raised pads 22. Electrically conductive material 70 is preferably applied to raised pads 22 by pressing electrically conductive material 70 as a frangible adhesive laminate sheet against raised pads 22 and then pulling electrically conductive material 70 as a frangible adhesive laminate sheet off of substrate 20. When electrically conductive material 70 as a frangible adhesive laminate sheet is pulled off of substrate 20, those areas of the laminate sheet that were pressed into contact with raised pads will remain of the upper surfaces of raised pads 22, and the remainder of the laminate sheet will be removed from substrate 20. These remaining portions of electrically conductive material 70 as a frangible adhesive laminate sheet that remain adhered to the upper surfaces of raised pads 22 form electrically conductive tracks 42. Alternatively, electrically conductive material 70 in the form of electrically conductive ink is screen printed on only the upper surfaces of raised pads 22. These screen printed upper surfaces of raised pads 22 form electrically conductive tracks 42. Further alternatively, electrically conductive material 70 in the form of electrically conductive ink or paint is applied on only the upper surfaces of raised pads 22 by rolling electrically conductive material 70 in the form of electrically conductive ink or paint onto the upper surfaces of raised pads 22 or by pressing the upper surfaces of raised pads 22 against a member (such as a blotter) having conductive material 70 in the form of electrically conductive ink or paint thereon, the latter method being analogous to "inking" a rubber stamp having raised lettering by pressing the rubber stamp onto an ink pad. These painted upper surfaces of raised pads 22 form electrically conductive tracks 42.

Substrate subassembly 40 is further assembled such that heat sinks 30 are positioned onto heat sink reception recesses 26 quick connect magnets 34 are affixed into quick connect magnet reception holes 24, mounting magnet 36 is affixed to mounting magnet reception pocket 25, positive lead wire 37 is affixed in positive lead wire reception slot 27 and electrically connected to an electrically conductive track 42, and negative lead wire 38 is affixed in negative lead wire reception slot 28 and electrically connected to an electrically conductive track 42.

ECBA 10 is assembled such that LED chips 80 are connected to a first electrically conductive track 42 on a first end and to a second electrically conductive track 42 on a second end, and such that an electrical circuit is formed from positive lead wire 37, through LED chips 80 and electrically conductive tracks 42, and to negative lead wire 38. Cover 90 is positioned on substrate subassembly 40 such that LED chips 80 are positioned in LED chip openings 92. ECBA 10 is secured by affixing fasteners into mounting holes 29, 32 and 94.

In practice, when assembled ECBA 10 is electrically energized via lead wires 37 and 38, light will emit from LEDs 80 while ECBA 10 is cooled at least in part by air flowing through open channels 23. ECBA 10 may be easily and quickly positioned on a metallic surface by means of mounting magnet 36 being placed in magnetically adhering contact to such metallic surface. Further, a plurality of ECBAs 10 may be magnetically connected together by placing quick connect magnets 34 of a first instance of ECBA 10 into magnetic contact with quick connect magnets 34 of a second instance of ECBA 10. In such arrangement of a plurality of ECBAs 10, ECBAs 10 are preferably arranged such that ECBAs 10 are electrically connected in series by means of lead wires of the various ECBAs 10.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A light emitting ECBA having at least one LED and a nonconductive substrate, wherein said substrate includes a plurality of raised pads having at least one open channel formed therebetween, each of said raised pads having an upper surface that forms the base of an electrically conductive track.

2. The light emitting ECBA of claim 1, wherein said upper surfaces of said raised pads are substantially coplanar.

3. The light emitting ECBA of claim 1, wherein said at least one open channel is adapted to allow air to flow therethrough so as to cool said ECBA.

4. The light emitting ECBA of claim 1, wherein said ECBA includes a mounting magnet adapted so as to provide for the removable mounting of said ECBA onto a metallic surface.

5. The light emitting ECBA of claim 1, wherein said ECBA includes at least one connecting magnet adapted so as to provide for the magnetic connection of said ECBA to a second instance of said ECBA.

6. An ECBA having a nonconductive substrate, wherein said substrate includes a plurality of raised pads having at least one open channel formed therebetween, each of said raised pads having an upper surface that forms the base of an electrically conductive track.

7. The ECBA of claim 6, wherein said upper surfaces of said raised pads are substantially coplanar.

8. The ECBA of claim 6, wherein said at least one open channel is adapted to allow air to flow therethrough so as to cool said ECBA.

9. The ECBA of claim 6, wherein said ECBA includes at least one LED.

10. The ECBA of claim 6, wherein said ECBA includes a mounting magnet adapted so as to provide for the removable mounting of said ECBA onto a metallic surface.

11. The ECBA of claim 6, wherein said ECBA includes at least one connecting magnet adapted so as to provide for the magnetic connection of said ECBA to a second instance of said ECBA.

12. A nonconductive ECBA substrate having a plurality of raised pads, said plurality of raised pads having at least one open channel formed therebetween and adapted to allow air to flow therethrough so as to cool said substrate, each of said raised pads having an upper surface that forms the base of an electrically conductive track.

13. The nonconductive ECBA of claim 12, wherein said upper surfaces of said raised pads are substantially coplanar.

14. The nonconductive ECBA of claim 12, wherein said ECBA includes at least one LED.

15. The nonconductive ECBA of claim 12, wherein said ECBA includes a mounting magnet adapted so as to provide for the removable mounting of said ECBA onto a metallic surface.

16. The nonconductive ECBA of claim 12, wherein said ECBA includes at least one connecting magnet adapted so as to provide for the magnetic connection of said ECBA to a second instance of said ECBA.

17. A method of manufacturing a nonconductive ECBA substrate comprising providing a nonconductive ECBA substrate having a plurality of raised pads, each of said raised pads having an upper surface, and wherein said plurality of raised pads have at least one open channel formed therebetween and adapted to allow air to flow therethrough so as to cool said substrate, and causing an electrically conductive track to be affixed to at least one said upper surface of said raised pads.

18. The method of claim 17, wherein said substrate is assembled in and forms a component of an ECBA.

19. The method of claim 18, wherein said ECBA includes at least one LED.

20. The method of claim 17, wherein said upper surfaces of said raised pads are substantially coplanar.

21. The method of claim 17, wherein said step of causing an electrically conductive track to be affixed to at least one said upper surface of said raised pads defines at least one of adhering a frangible electrically conductive adhesive sheet onto said upper surfaces of said raised pads and removing from said substrate portions of said sheet not in adhering contact to said upper surfaces of said raised pads, screen printing electrically conductive ink onto said upper surfaces of said raised pads, rolling electrically conductive ink onto said upper surfaces of said raised pads, and pressing said upper surfaces of said raised pads into electrically conductive paint.

* * * * *